(12) United States Patent  (10) Patent No.: US 9,417,945 B2
Authement et al.  (45) Date of Patent: Aug. 16, 2016

(54) ERROR CHECKING AND CORRECTION FOR NAND FLASH DEVICES

(71) Applicant: International Business Machines Corporation, Armonk, NY (US)

(72) Inventors: Shawn P. Authement, Round Rock, TX (US); Jente B. Kuang, Austin, TX (US); Gi-Joon Nam, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 14/197,707

(22) Filed: Mar. 5, 2014

(65) Prior Publication Data

US 2015/0254129 A1    Sep. 10, 2015

(51) Int. Cl.
*G06F 11/10*  (2006.01)
*G11C 29/52*  (2006.01)
*G06F 11/07*  (2006.01)
*G11C 29/04*  (2006.01)

(52) U.S. Cl.
CPC .......... *G06F 11/076* (2013.01); *G06F 11/1048* (2013.01); *G11C 2029/0411* (2013.01)

(58) Field of Classification Search
CPC .............. G06F 11/1048; G06F 11/076; G11C 2029/0411
See application file for complete search history.

(56) References Cited

U.S. PATENT DOCUMENTS

| 8,112,692 B2 | 2/2012 | Lee et al. |
| 8,140,935 B2 | 3/2012 | Hong et al. |
| 8,161,354 B2 | 4/2012 | Chen |
| 8,464,137 B2 | 6/2013 | Franceschini et al. |
| 8,468,431 B2 | 6/2013 | Steiner et al. |
| 8,473,815 B2 | 6/2013 | Chung et al. |
| 8,566,671 B1 | 10/2013 | Ye et al. |
| 2004/0153902 A1 | 8/2004 | Machado et al. |

(Continued)

FOREIGN PATENT DOCUMENTS

WO    WO 2012/140695 A1    10/2012

OTHER PUBLICATIONS

Mariano, Marina, "ECC Options for Improving NAND Flash Memory Reliability", Software Spotlight, Micron Technology, Inc., Rev. C, Jan. 2012, 7 pages. Jan. 2012.

(Continued)

*Primary Examiner* — Albert Decady
*Assistant Examiner* — Kyle Vallecillo
(74) *Attorney, Agent, or Firm* — Francis Lammes; Stephen J. Walder, Jr.; William J. Stock

(57) ABSTRACT

Mechanisms are provided, in a Not AND (NAND) flash memory device, for providing hybrid error correction management. A NAND flash memory module and a node controller coupled to the NAND flash memory module are provided along with a hardware logic implemented error correction code (ECC) engine associated with the node controller. The node controller is configured to determine whether an error count is less than or equal to a first threshold number of error bits and, in response to the error count being less than or equal to the first threshold number of error bits, performing correction of the error bits by the hardware logic implemented ECC engine associated with the node controller. The node controller is also configured to forward uncorrected data to a software logic implemented ECC engine, in response to the error count being greater than the first threshold number of error bits.

16 Claims, 8 Drawing Sheets

(56) References Cited

U.S. PATENT DOCUMENTS

| | | | |
|---|---|---|---|
| 2009/0276570 A1* | 11/2009 | Cheng | G06F 11/3419 711/115 |
| 2009/0282308 A1* | 11/2009 | Gutsche et al. | 714/746 |
| 2011/0182119 A1* | 7/2011 | Strasser et al. | 365/185.03 |
| 2011/0307758 A1* | 12/2011 | Fillingim | 714/758 |
| 2012/0096333 A1 | 4/2012 | Kang et al. | |
| 2013/0254630 A1 | 9/2013 | Murray et al. | |

OTHER PUBLICATIONS

Sharon, Eran et al., "ECC/DSP System Architecture for Enabling Reliability Scaling in Sub-20nm NAND", SanDisk Flash Summit, Aug. 2013, 40 pages.

U.S. Appl. No. 15/176,714, 1 page.

\* cited by examiner

ERROR CHECKING AND CORRECTION FOR NAND FLASH DEVICES

BACKGROUND

The present application relates generally to an improved data processing apparatus and method and more specifically to mechanisms for error checking and correction for "Not AND" (NAND) flash devices.

Flash memory is an electronic non-volatile computer storage medium that can be electrically erased and reprogrammed. There are two main types of flash memory, which are named after the NAND and NOR logic gates, i.e. NAND flash memory and NOR flash memory. NAND type flash memory may be written and read in blocks (or pages) which are generally much smaller than the entire device. NOR type flash allows a single machine word (byte) to be written to an erased location, or read independently. The NAND type of flash memory is primarily used in main memory, memory cards, USB flash drives, solid-state drives or devices (SDDs), and similar products, for general storage and transfer of data. The NOR type, is used as a replacement for the older Erasable Programmable Read Only Memory (EPROM) devices and as an alternative to certain kinds of Read Only Memory (ROM) applications.

NAND flash architecture memory devices are accessed much like block devices, such as hard disks. Each block consists of a number of pages and associated with each page are a few bytes (typically 1/32 of the data size) that can be used for storage of an error correcting code (ECC) checksum. While reading and programming is performed on a page basis, erasure can only be performed on a block basis.

NAND devices rely on Error Correction Codes (ECCs) to compensate for bits that may spontaneously fail during normal device operation. If the ECC cannot correct the error during read, it may still detect the error. When doing erase or program operations, the device can detect blocks that fail to program or erase and mark them as "bad." The data is then written to a different, "good" block, and a bad block map is updated.

SUMMARY

In one illustrative embodiment, in a Not AND (NAND) flash memory device, for providing hybrid error correction management is provided. The method includes providing a Not AND (NAND) flash memory module and a node controller coupled to the NAND flash memory module in the NAND flash memory device. The method further includes providing a hardware logic implemented error correction code (ECC) engine associated with the node controller. Moreover, the method includes configuring the node controller to determine whether an error count is less than or equal to a first threshold number of error bits and, in response to the error count being less than or equal to the first threshold number of error bits, performing correction of the error bits by the hardware logic implemented ECC engine associated with the node controller. In addition, the method includes configuring the node controller to forward uncorrected data to a software logic implemented ECC engine, in response to the error count being greater than the first threshold number of error bits.

In yet another illustrative embodiment, a Not AND (NAND) flash memory device is provided that includes a Not AND (NAND) flash memory module, a node controller coupled to the NAND flash memory module, and a hardware logic implemented error correction code (ECC) engine associated with the node controller. The node controller is configured to determine whether an error count is less than or equal to a first threshold number of error bits and, in response to the error count being less than or equal to the first threshold number of error bits, perform correction of the error bits by the hardware logic implemented ECC engine associated with the node controller. The node controller is further configured to forward uncorrected data to a software logic implemented ECC engine, in response to the error count being greater than the first threshold number of error bits.

In other illustrative embodiments, aspects of the illustrative embodiments may be implemented as a computer program product comprising a computer useable or readable medium having a computer readable program is provided. The computer readable program, when executed on a computing device, causes the computing device to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
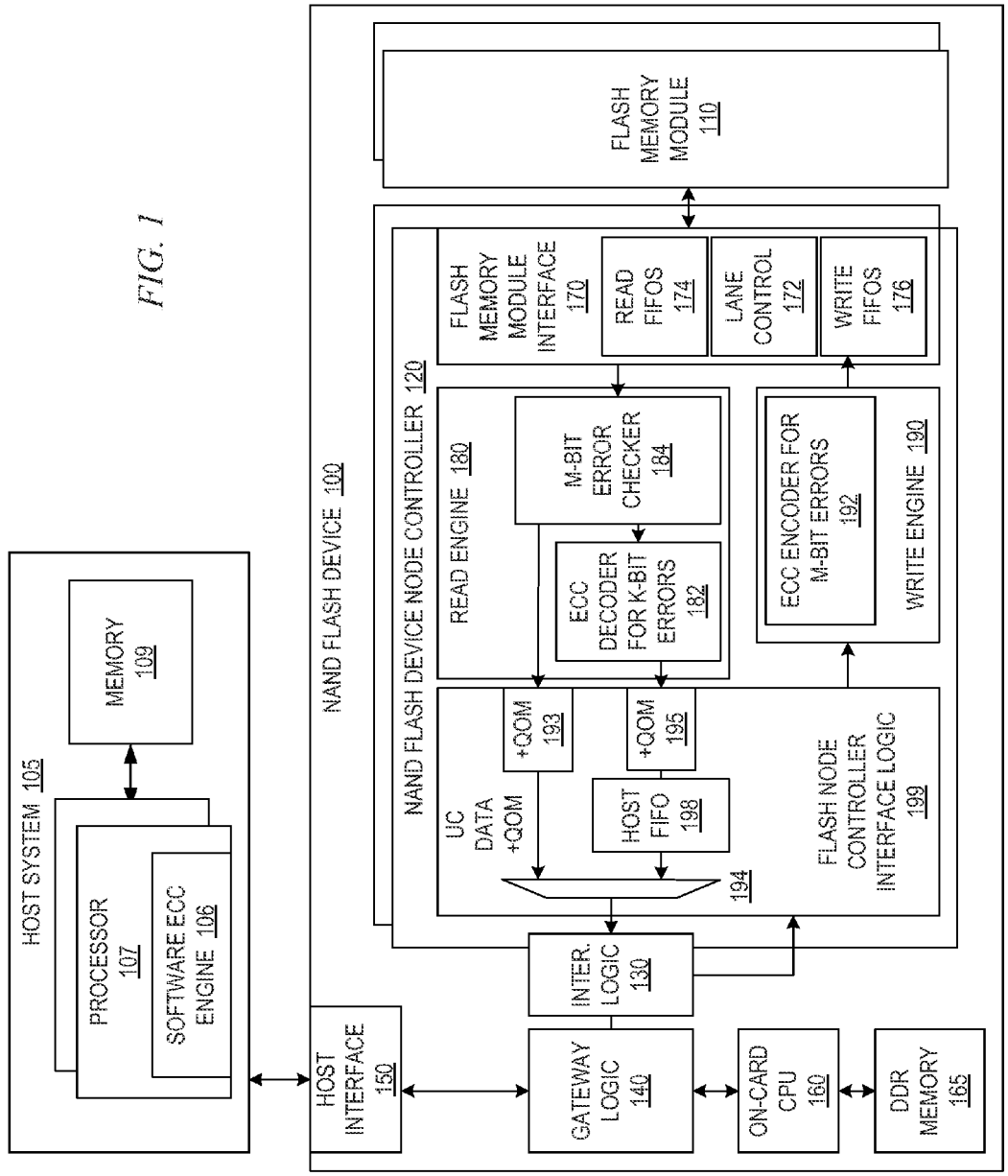
FIG. 1 is an example block diagram of a NAND flash device in accordance with one illustrative embodiment.

The desire for improvement in error checking and correction (ECC) for NAND flash devices has been intensively driven by the aggressive feature size scaling of such devices, the frequency of occurrence of read disturbances, Multi-level cell (MLC) and Triple-level cell (TLC) technologies entering mainstream utilization, development of dense 3D NAND offerings, and ever stringent endurance requirements for all classes of NAND devices. To provide improved ECC mechanisms for NAND flash devices, e.g., built-in NAND flash memories of computing devices, NAND flash cards inserted into card slots or otherwise coupled to computing devices, portable NAND flash memory devices, or the like, one may utilize hardware ECC implemented on flash node controllers, i.e., the circuitry built into the NAND flash device which is responsible for controlling the overall operation of the NAND flash device. While implementing ECC mechanisms in hardware node controllers provides the highest ECC performance since the ECC operations are offloaded from the host system processors, the design becomes very complex and expensive since a large number of hardware circuitry elements, e.g., hardware logic gates and connections, are required to implement the ECC functionality.

This is especially true as the strength of the error correction increases, i.e., the number of bits for which correction is provided increases. That is, weak error correction is typically able to perform error correction on one or two bit-errors whereas strong error correction may require the ability to correct a relatively large number of bits of error. The determination as to whether an error correction is weak or strong is dependent upon the relative position of the error correction to the lower and upper limits on the range of potential error bit correction to be performed. That is, raw NAND flash memory modules typically have a minimum error correction that is required to ensure correct functionality of the module, e.g., 1 bit error correction. Moreover, NAND flash storage products, e.g., NAND flash memory cards, portable NAND flash memory devices, and the like, that incorporate such NAND flash modules have a targeted reliability specification which represents the maximum number of error bits that can be corrected by the system, e.g., M bits. This gives a range of 1 to M bits of error correction with the actual error correction being within this range and either being weak, i.e. relatively closer to the minimum of the range, e.g., 1, or strong, i.e. relatively closer to the maximum of the range, e.g., m.

As the strength of error correction requirements increases, so does the complexity of the hardware circuitry for performing such ECC operations since a larger number of bits of error must be handled requiring a larger number of transistors, gates, connections, and additional circuitry. As a result, hardware based ECC operations are limited to only handling weak error correction operations.

On the other hand, another option is to utilize software ECC mechanisms which execute on a host system processor rather than in the NAND node controller. Such software ECC mechanisms allow for relatively less complex NAND flash node controllers and, relatively smaller delays in the NAND flash device itself, since the ECC operations are performed by the software executing in the host system rather than being implemented in the hardware logic of the NAND device. However, the error correction process is much slower with software based ECC mechanisms because of the need to utilize the host processors to perform the ECC operations. Furthermore, the need to utilize host processors to perform the ECC operations causes extra workloads to be performed by the host system when the host system could be using the host processor resources to perform other useful work.

In another possible ECC handling mechanism, a dedicated hardware ECC controller mechanism may be provided between the NAND flash memory modules and the node controller. While this solution is more preferred than the software ECC mechanism solution since some of the benefits in performance due to hardware based mechanisms is achieved due to the offloading of ECC operations to the dedicated hardware ECC controller, there is still significant reduction in performance due to the need to forward the error data to a separate unit for ECC operations which introduces delay into the ECC operations. Moreover, the addition of a dedicated hardware ECC mechanism increases the cost of the solution relative to software based solutions.

The issues with regard to cost and performance become more of an issue as the complexity of NAND flash devices increases. That is, as the NAND flash devices increase in complexity and storage size, the number of errors that occur in such NAND flash devices increases, especially since NAND flash devices are inherently error prone. This requires a larger number of error bits to be corrected requiring stronger ECC operations than can be typically handled with hardware based ECC mechanisms. Moreover, as NAND flash device lifetimes increase, the number of error bits also increases, compounding the ECC performance issues.

To address these concerns, the illustrative embodiments utilize a hybrid hardware/software error checking and correction (ECC) mechanism that utilizes both hardware and software based ECC and determines which of the mechanisms to utilize based on a strength of ECC that is required to perform the error correction for the particular set of data being read from the NAND flash memory modules. With the mechanisms of the illustrative embodiments, a NAND flash device includes raw NAND flash memory modules needing m-bit correction strength, where M is a value indicative of a strong ECC operation, e.g., greater than 2-bit correction strength. The NAND flash device node controller (hereafter referred to simply as the "node controller") is configured to have a hardware based ECC engine capable of correcting up to k-bits of errors, where k is less than m, leveraging node controller size, complexity, gate count, latency, and percentage of correctable bit error rate (BER) by the node controller.

The logic of the node controller is configured such that when the actual error bit count is less than or equal to k, the error bits are detected and corrected by the hardware ECC engine of the NAND flash device node controller. The logic of the node controller is further configured such that when the actual error bit count is greater than k, the error bits are detected by the node controller, but the ECC operations for correcting the error bits is performed in software executing on one or more processors of the host system. It should be appreciated that the value of k is set such that the occurrence of events requiring ECC operations to be performed by software executing on the host system processor(s) is relatively rare. Thus, for most errors, the error bits are corrected using the hardware ECC engine of the NAND flash device node controller, however logic is provided for facilitating software based ECC operations for the times when the number of error bits exceed the k-value.

In response to a read operation for reading data from the NAND flash device, if the software based ECC operation path is invoked by the hardware of the NAND flash device node controller on the data read from the flash memory module, a read queue order number is assigned to the stream of read data packets corresponding to the would-be position in the read FIFO for tracking. The hardware ECC engine of the NAND flash device node controller is bypassed and the uncorrected read data packets are sent through gateway logic and host interface to the host system for ECC processing by the software ECC engine executing on one or more processors of the host system. The NAND flash device node controller read queue is modified to assign markers of read queue position for the read data packets. The gateway logic includes an added function for tracking an arbitrating read queue order based on the assigned markers. When the host system requires the read data corresponding to a queue marker for which error correction by the host system was performed, the read FIFO pipeline is held and the host system software corrected read data is utilized with the processing of read queue data being resumed thereafter. Thus, the queue markers of the illustrative embodiments facilitate out-of-order processing of data for host system software ECC operations.

In some illustrative embodiments, the k and M-values mentioned above are fixed values set a priori by a system administrator, through design methodologies, or the like. For example, in one illustrative embodiment, a mechanism is provided for setting the lower and upper bounds for the k-value based on empirical testing of workloads on a NAND flash device or model of a NAND flash device such that a range of k-values is determined. From this range of k-values, a k-value suitable to the performance requirements of the particular implementation of the NAND flash device desired is selected and used to configure the hardware ECC circuitry of the NAND flash device node controller. Moreover, in some illustrative embodiments, based on determined workloads, the value for the upper bound of ECC by host system software mechanisms may be modified, e.g., financial data workloads may require a higher M-value than graphical data processing workloads.

In some illustrative embodiments, the setting of the k and M-values may be performed dynamically based on the detected types of workloads being processed. For example, k-value switching or setting hardware may be provided in the NAND flash device node controller for setting the value of the k-value dynamically based on workload, number of errors encountered, detected latency in error correction operations, or any other operational parameters. Similarly, m-value switching or setting software may be provided in the software ECC mechanisms of the host system for adjusting the m-value when necessary based on detected operational parameters, e.g., if the number of error bits exceeds a current m-value, the m-value may be adjusted to accommodate the requirement for stronger ECC operations.

As mentioned above, in some illustrative embodiments, the software based ECC operations are performed by software ECC mechanisms in the host system to which the NAND flash device is coupled, such as via a host system interface. However, the illustrative embodiments are not limited to such. Rather, in some NAND flash devices, a processor may be provided on the NAND flash device which may be configured to perform software based ECC operations on the NAND flash device itself. In this way, both hardware and software based ECC operations are performed within the NAND flash device thereby eliminating the need to invoke ECC operations on the host system. Hence, host system resources are freed from having to be used to perform ECC operations and instead may perform other useful work. Moreover, the host system only receives corrected data from the NAND flash device.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 is an example block diagram of a NAND flash device in accordance with one illustrative embodiment. It should be appreciated that the NAND flash device 100 in FIG. 1 is an example of a NAND flash memory card for use with a host system 105 which may be coupled to the host system 105 via any known or later developed memory, bus, or peripheral interface, referred to in FIG. 1 as host interface 150. In one example, the NAND flash device 100 is coupled to a host system 105 via a Peripheral Component Interconnect Express (PCIe) interface 150. However, it should be appreciated that other host system interfaces may be used without departing from the spirit and scope of the illustrative embodiments. For example, a Universal Serial Bus (USB) interface may be utilized with the NAND flash device 100 being part of a portable storage device or external device coupled to the host system via a USB port. For purposes of the following description it will be assumed that the NAND flash device 100 is a NAND flash card that is coupled to the host system 105 via physical coupling with a PCIe slot associated with the host system 105 and through which data communication is made possible via the host interface 150 which is a PCIe interface.

As shown in FIG. 1, the NAND flash device 100 includes one or more flash memory modules 110 coupled to one or more NAND flash device node controllers 120 (a single NAND flash device node controller 120 is shown in detail, however it should be appreciated that a single NAND flash device 100 may comprise a plurality of such NAND flash device node controllers 120). The NAND flash device 100 further includes interface logic 130 coupled to gateway logic 140 through which data communication with the host system via the PCIe card interface 150. The gateway logic 140 further provides a data communication pathway through which the one or more NAND flash device node controllers 120 may communicate with an on-card processor 160, and on-card memory 165.

The NAND flash device node controller 120 of the NAND flash device 100 includes a flash memory module interface 170 comprising a lane controller 172, a multilane flash read FIFO 174, a multilane flash write FIFO 176. The flash memory module interface 170 provides a data communication interface between the flash memory module(s) 110 and a flash node controller read engine 180 and flash node controller write engine 190. The flash node controller read engine 180 and flash node controller write engine 190 are coupled to flash node controller interface logic 199 through which the flash node controller 120 communicates with interface logic 130 and gateway logic 140 to communicate data to/from a host system 105 and/or on-chip processor 160 and memory 165.

In accordance with the illustrative embodiments, the flash node controller read engine 180 includes an ECC decoder 182 configured to decode and perform ECC operations on bit errors that are k-bits or less. The ECC decoder 182 further includes m-bit error checker 184 which checks to determine if the number of error bits in the read data is greater than k-bits or not. The m-bit error checker 184, in response to determining that the number of error bits is greater than k-bits sends the uncorrected data to the flash node controller interface logic 199 for communication to the host system 105 for correction by software ECC engine 106 executed by the one or more processors 107 of the host system 105. In response to the m-bit error checker 184 determining that the number of error bits is equal to or less than k-bits, the data is provided to the ECC decoder 182 which performs error correction operations on the error bits in the ECC decoder 182 hardware and outputs the resulting corrected data to the flash node controller interface logic 199 which adds a queue order marker (QOM) via +QOM logic 195 and inputs the corrected data to the host FIFO 198. The term "+QOM" refers to the operation to append a queue order marker to the corrected/uncorrected data code word with the +QOM logic 195 being the circuit logic to perform the append operation. The QOM is a marker indicating a sequence ordering of the data relative to other data being read from the flash memory module 110. The QOM permits out-of-order processing of data by the host system 105, such as when performing out-of-order ECC operations on uncorrected data.

The uncorrected data output by the m-bit error checker 184 is also associated with a QOM by +QOM logic 193. Both the uncorrected data +QOM and corrected data +QOM are provided as inputs to the multiplexer 194. The multiplexer 194 receives a select control input (not shown) from the m-bit error checker 184 that causes the multiplexer 194 to output either the uncorrected data or the corrected data to the NAND flash device node controller interface logic 130 and gateway logic 140 based on whether or not the m-bit error checker 184 determines the number of error bits to be greater than k-bits or not. The multiplexer 194 outputs an aggregated read data stream to the host system interface logic. The aggregated read data stream may comprise corrected data, uncorrected data, or a combination of corrected and uncorrected data. The resulting either uncorrected read data +QOM or corrected read data +QOM is output to the host system 105 via the interface logic 130, gateway logic 140, and host interface logic 150. The m-bit error checking logic 184 keeps track of the error statistics with the NAND flash device node controller logic maintaining knowledge of whether particular portions of data are correct data or uncorrected data. Again, it should be appreciated that the data, either corrected or uncorrected, has queue order markers associated with it so that the order of the portions of data may be recreated in the host system. That is, the data in the aggregated read data stream may be out-of-order and the data order may be recreated in the buffers of the host system 105 based on the queue order markers associated with the different portions of data.

The corrected and uncorrected data in the aggregated read data stream are routed to the host system 105 which either stores and utilizes the corrected data in performing its operations, or performs software based ECC operations by the software ECC engine 106, executed on one or more processors 107, on the uncorrected data to generate corrected data which is then stored in memory 109 and utilized by the host system 105 to perform its operations. Thus, the data having error bits in excess of the k number of bits will be forwarded to the host system 105 in an uncorrected state with a queue order marker (QOM) and corrected by the software ECC engine 106. Data having error bits equal to or less than the k number of bits are corrected by the hardware of the NAND flash node controller 120 itself. Since the number of times that the number of error bits is equal to or less than k vastly outnumber the times that the number of error bits is in excess of k, the majority of errors are handled by the hardware of the NAND flash node controller 120 which leverages the speed of the hardware mechanisms without introducing additional complexity and delay by unnecessarily increasing the number of logic gates in the NAND flash node controller 120 so as to handle larger numbers of error bits. For those rare instances where the error bits are in excess of the k-value, the slower mechanisms of software ECC engine 106 are utilized providing the ability to handle larger numbers of error bits without having to increase the complexity and delay in the hardware of the NAND flash node controller.

As shown in FIG. 1, the NAND flash device node controller 120 further includes a flash node controller write engine 190 which also includes an ECC encoder for m-bit errors 192. The ECC encoder for m-bit errors 192 encodes write data that is written to the flash memory modules 110 with additional metadata fields used for determining if the write fails, such as due to noise or other sources of error in the hardware circuitry, e.g., parity information or the like. The ECC encoder for m-bit errors 192 forms code words by adding extra bits to the original data bits to allow the hashing, checksum, and other detection functions to flag errors incurred after encoding up until the data enters the error checker 184.

Thus, the mechanisms of the illustrative embodiment set forth in FIG. 1 provide for a hybrid approach to error checking and correction (ECC) operations that is dependent upon the strength of the ECC needed to correct the particular errors encountered. That is, when the strength of the required ECC is relatively weak, e.g., 1 or 2-bit errors that need to be correct, then the faster hardware based ECC engine within the NAND flash device node controller may be used to correct these weaker error conditions. However, if the strength of the required ECC is relatively strong, e.g., greater than 2-bit errors, then the ECC operation may be performed in the software ECC engine implemented in the host system. The determination and routing of error bits to the appropriate hardware/software ECC engines may be performed by hardware logic within the NAND flash device node controller when reading data from the flash memory modules, for example.

As described in FIG. 1, the mechanisms of the illustrative embodiments facilitate out-of-order processing of read data from the flash memory modules 110 by utilizing queue order markers (QOMs) that are associated with the portions of data evaluated by the ECC decoder for k-bit errors 182 and the m-bit error checker 184 by the +QOM logic 193, 195. The QOMs provide a mechanism by which the order of portions of data may be recreated. However, it should be appreciated that the present invention is not limited to such. Rather, in architectures where out-of-order processing of data is not implemented or needed, the queue order marker mechanisms of the illustrative embodiments may be eliminated. The architecture is essentially the same as shown in FIG. 1 but with the multiplexing of the uncorrected data and the corrected data being able to be performed prior to submitting the data to the read FIFO for output as an aggregated read data stream. This modified architecture is shown in FIG. 2 where it can be seen that the uncorrected data and corrected data output by the m-bit error checker 184 and ECC decoder for k-bit errors 182, respectively, are input to the multiplexer 210 which then outputs the aggregated read data stream to the read FIFO 172.

Figure 2:
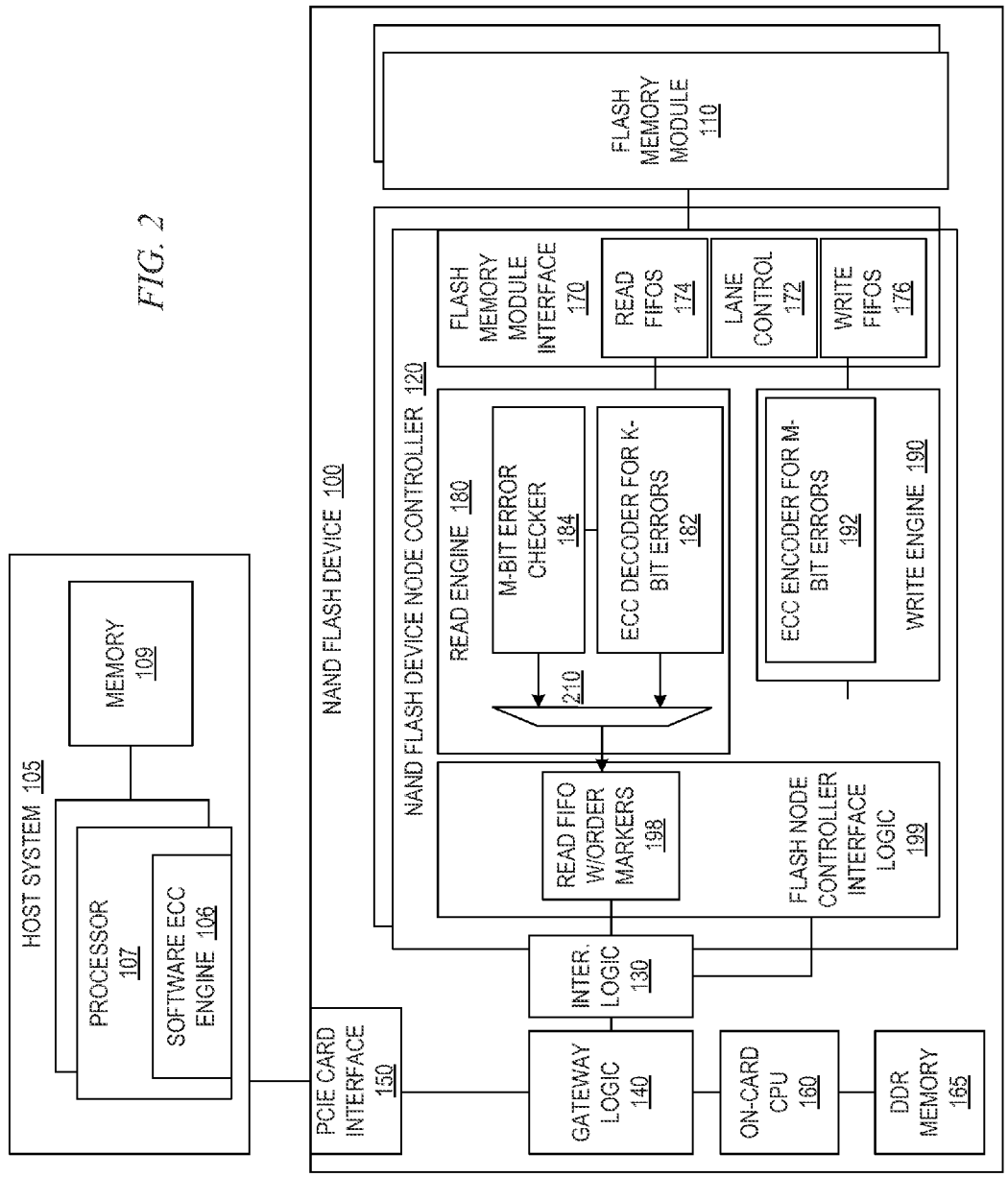
FIG. 2 is an example block diagram of a NAND flash device, in accordance with one illustrative embodiment, in which out-of-order processing of portions of data is not implemented.

It should be appreciated that the particular configuration and arrangement of elements shown in FIGS. 1 and 2 are only exemplary and are not intended to state or imply any limitation as to the particular architecture with which the mechanisms of the present invention may be implemented. Various other arrangements of logic may be utilized with the mechanisms of the illustrative embodiments to achieve the hybrid software/hardware ECC handling of data read/written to flash memory modules without departing from the spirit and scope of the illustrative embodiments. Furthermore, it should be appreciated that many detailed logic elements of the various portions of the NAND flash device 100 and NAND flash device node controller 120 have been eliminated from the figures for ease of explanation and focusing on the operation of the mechanisms of the illustrative embodiments. However, actual NAND flash devices 100 and NAND flash device node controllers 120 comprise many more logic elements than shown in FIGS. 1 and 2 but with which the mechanisms of the illustrative embodiments may be integrated and operate with.

The above illustrative embodiments assume that the k-value, indicating the boundary between hardware and software-based ECC operations being performed on the data being read from the flash memory module 110, is a fixed value that is hard wired into the hardware logic of the NAND flash device node controllers 120. The k-value itself may be selected from a range of k-values determined to be appropriate for a desired performance of the NAND flash device 100. For example, during a design process, empirical processes, modeling, or the like, may be used to determine a range of k-values from which an appropriate k-value for a desired performance may be selected. In one illustrative embodiment, a minimum k-value may be identified by submitting workloads to an actual or modeled NAND flash device and iteratively increasing the k-value until the aggregated access time equals or exceeds a threshold timing parameter. A maximum k-value may be identified by determining the per-access read latency with k-bit hardware ECC invoked and determining if a timing specification is met. The k-value may then be incrementally increased with each check of the per-access read latency with the timing specification until the timing specification value is met. The resulting kmin and kmax values may then be used to specify the permissible range of k-values from which a k-value meeting desired performance conditions is selected and the resulting NAND flash device node controller may be designed with hardware logic implementing the k-value based operation for hybrid ECC hardware/software operation. This operation for determining kmin and kmax will be described in greater detail hereafter.

Figure 3:
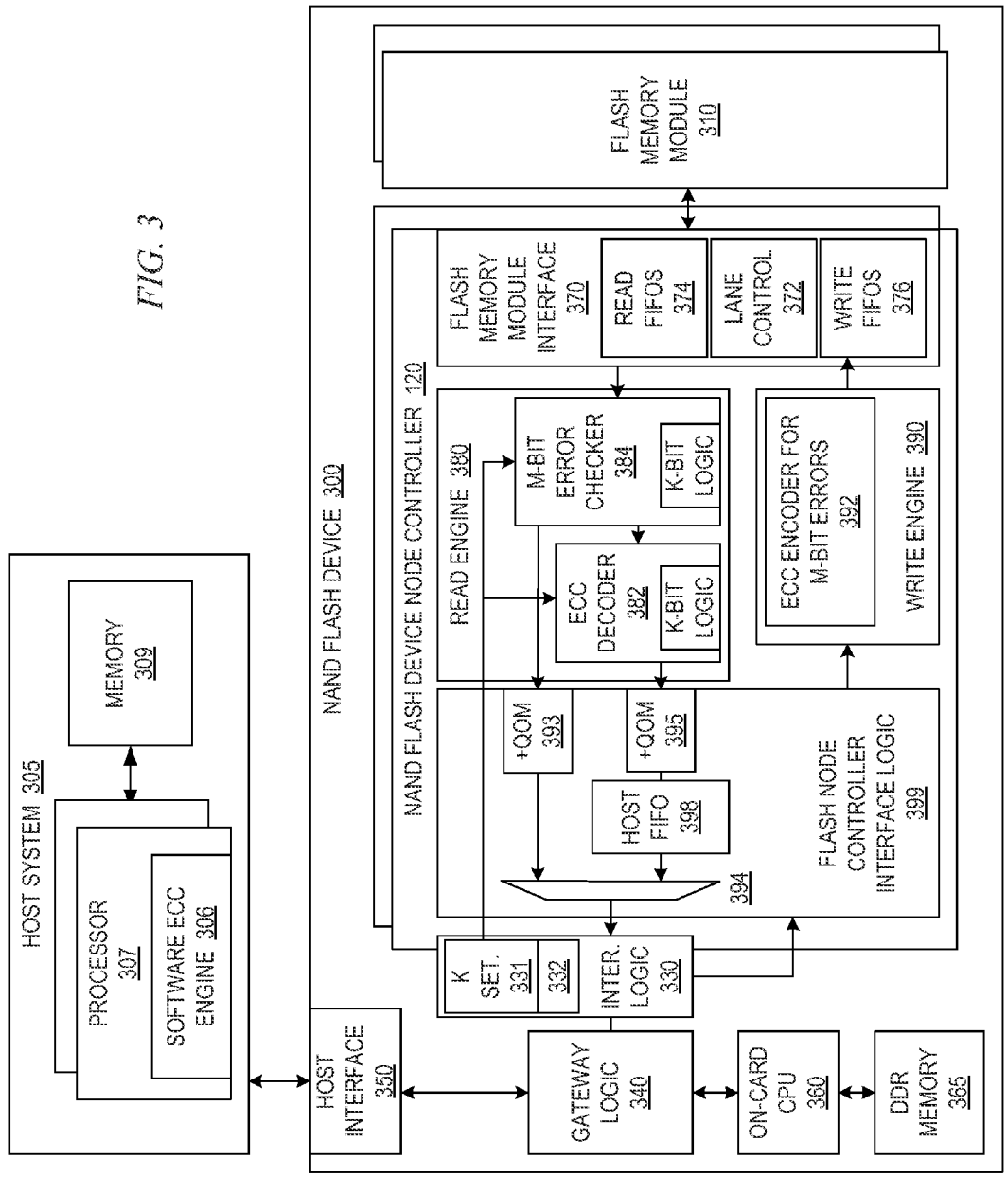
FIG. 3 is an example diagram of a NAND flash device in which dynamical setting of the k-value for hardware/software ECC operations is performed in accordance with one illustrative embodiment.

In addition, in some embodiments, the k-value utilized for determining whether to perform hardware or software ECC operations may be dynamically determined during runtime operation. FIG. 3 is an example diagram of a NAND flash device in which dynamical setting of the k-value for hardware/software ECC operations is performed in accordance with one illustrative embodiment.

As shown in FIG. 3, the hardware logic providing the ECC decoder for k-bit errors 382 and m-bit error checker 384 may be configured to set the k-value based on dynamically identified conditions. For example, the average latency of the ECC operations, either hardware, software, or both, can be measured by the NAND flash device node controller 320 interface logic 330 and used to generate a feedback control signal to the m-bit error checker 384 to set the k-value used by the m-bit error checker 384 to determine whether hardware or software ECC operations are to be utilized. The actual determination of the k-value to be used may be performed by logic in the interface logic 330, such as k-setting logic 331, logic provided in the m-bit error checker 384 based on feedback data regarding the detected operational characteristics of the NAND flash device provided by the interface logic 330, such as logic 332, or the like.

For example, in one illustrative embodiment, the interface logic 330, such as via operational characteristic logic 332, gathers data regarding the average latency of read/write operations performed by the NAND flash device node controller 320 with regard to data in the flash memory module 310 and uses this information to select a k-value setting based on the average latency. For example, if the average latency is relatively long, as may be measured by one or more threshold values, then the k-value may be increased to thereby increase the likelihood that hardware based ECC operations will be performed for any particular set of data, thereby decreasing the latency. If the average latency is relatively short, then the k-value may be decreased such that software based ECC operations are more likely to be employed and stronger error correction is made available.

Such analysis may be performed by logic in the interface logic 330, the flash node controller interface logic 399, the read engine 380, such as in the m-bit error checker 384, for example, or the like. Specialized logic (not shown) may also be provided on the NAND flash device 300, in the NAND flash device node controller 320, or the like, to facilitate the collection of such data regarding the performance of read/write operations by the NAND flash device 300 and performing analysis of such data to dynamically determine a suitable k-value to be used by the NAND flash device node controller 320. Of course, the interface logic 330 may also be configured to analyze other runtime operational characteristics of read/write operations and/or ECC operations on the data being read/written to the flash memory module 310, in addition to or in replacement of the analysis to determine an average latency, and generate a control signal for setting the k-value.

The resulting selected k-value may be used as a basis for sending a feedback control signal to the read engine 380, and in particular the ECC decoder 382 and m-bit error checker 384, for setting the logic of the read engine 380 to implement the ECC operations using the selected k-value. The control signal informs the logic of the ECC elements of the boundary between hardware and software based ECC operations to be performed on data read from the flash memory module 310. Thus, under some conditions, the k-value may be set to 2-bits indicating that data being read from the flash memory module 310 that has 1 or 2 bits that are determined to be erroneous will have the ECC operations for correcting those bits performed in the ECC decoder for k-bit errors 382. Under other conditions, e.g., average latency exceeding a threshold value, the k-value may be dynamically set to 4 bits causing a larger number of read operations to have their data corrected using hardware-based ECC logic of the ECC decoder 382 and thereby decrease latency of read operations.

The actual setting of the k-value in the hardware of the ECC decoder for k-bit errors 382 may comprise the enablement of particular configurations of transistors and other electronic devices of the ECC decoder for k-bit errors 182 for facilitating the implementation of the k-value. For example, different arrays of hardware circuitry, or portions of hardware circuitry, may be selectively enabled based on the setting of the k-value by the control signal received. In one illustrative embodiment, two separate circuitry configurations may be provided, one for a k-value equal to the kmin value determined during the design operation mentioned above, and a second configured to implement a k-value equal to the kmax value determined during the design operation.

A switching mechanism, such as may be provided in the "k-bit logic" of the ECC decoder 382, for example, may be provided for switching between the kmin and kmax configurations based on the k-value control signal received. Thus, if the control signal indicates that the k-value should be switched to kmax, then the switch is switched to enable the circuit configuration, e.g., an array or the like, corresponding to kmax. If the control signal indicates that the k-value should be switched to kmin, then the switch is switched to enable the circuit configuration for kmin. It should be appreciated that various circuitry configurations may be provided for various k-values other than kmin and kmax, such as other distinct k-values in the range between kmin and kmax, with switching or other enablement logic being provided for enabling these circuitry configurations. For example, an array of logic elements may be provided that is capable of handling discrete k-values between kmin and kmax with portions of the array being enabled dependent upon the particular k-value selected.

It should be appreciated that the variability of the k-values in the NAND flash device of the illustrative embodiments provides various advantages as touched on above including the ability to enable runtime NAND flash device error correction characteristic customizations without swapping hardware and without losing data storage on the NAND flash device. Moreover, the variability of the k-values in the NAND flash device also provides the ability to configure NAND flash devices with the same node controller to be sold as devices with different reliability grades. This allows for ease of manufacture with versatility for providing different types of devices at different price points for different customers.

Moreover, in some illustrative embodiments, a NAND flash device may have multiple node controllers associated with the same or different NAND flash memory modules with two or more of the node controllers implementing different k values from one another. As a result, workloads of different types may be routed to different node controllers based on the desired strength of error correction for the workload, e.g., stock market trade transaction workloads may require stronger error correction than graphic rendering workloads and thus, may be routed to different node controllers based on the particular k values implemented by the node controllers. Such routing may be accomplished, for example, by hardware logic implemented in the NAND flash device, e.g., in the gateway logic 340 or other logic module in FIG. 3 or a separate logic module not shown in FIG. 3.

The above illustrative embodiments have been described in the context of the software ECC operations being performed in a host system 105, 305 that is external to the NAND flash device 100, 300, e.g., in software ECC engine 106, 306. However, the illustrative embodiments are not limited to the software ECC operations being performed in the host system 105, 305. To the contrary, the NAND flash device 100, 300 itself may comprise an on-device processor, such as on-device processor 160, 360, and corresponding memory 165, 365. This on-device processor may be configured to implement software ECC logic, such as by storing software instructions for performing ECC operations in the on-device memory 165, 365. In such a case, rather than sending uncorrected data to an external host system 105, 305 via the gateway logic 140, 340, and host interface 150, 350, the host system 105, 305 may always receive correct data from the NAND flash device 100, 300 since all ECC operations are performed on the NAND flash device 100, 300 either by the on-device hardware ECC logic of the read engine 180, 380, or by the on-device software ECC logic implemented by the on-device processor 160, 360.

Thus, in such an illustrative embodiment, the software ECC engine 106, 306 may be moved from the host system 105, 305 to the processor 160, 360 on the NAND flash device 100, 300 by storing instructions for the software ECC engine 106, 306 in the on-device memory 165, 365 which are then loaded and executed by the on-device processor 160, 360. The software ECC engine 106, 306, whether implemented in the host system 105, 305 or on the NAND flash device 100, 300, performs ECC operations on erroneous data where the number of error bits is in the range of k+1 to M.

As with the k-value discussed above, the illustrative embodiments described above with regard to FIGS. 1-3 assume a fixed M-value, however the illustrative embodiments are not limited to such. Rather, the M-value, as with the k-value, may be dynamically modified based on detected runtime operational conditions. In the case of the M-value for controlling the range of software ECC operations, the M-value may be set, for example, in software configuration parameters utilized by the software ECC engine 106, 306. The setting of these software configuration parameters may be performed by the software ECC engine 106, 306 itself based on detected operational characteristics of the software ECC engine 106, 306. For example, if the software ECC engine 106, 306 detects that more than a threshold number of workloads received by the software ECC engine 106, 306, within a predetermined period of time, have a number of erroneous bits exceeding the currently set M-value, such as by comparing the number of error bits in the received data for ECC to the currently set M-value, then the software ECC engine 106, 306 may determine that a change in M-value is needed and may increase the M-value accordingly. This may in turn result in an increase of the number of resources allocated to the software ECC engine 106, 306, e.g., number of processors, amount of memory allocated, time slices of processor resources, or the like. Thus, in order to optimize the utilization of resources of the host system 105, 305, or the on-device processor 160, 360, it is beneficial to keep the M-value as small as possible but provide a mechanism to dynamically modify the M-value when needed to accommodate increased sizes of error bits but then return the M-value to a smaller value when possible.

Alternatively, types of workloads received by the software ECC engine 106, 306, types of other processes being executed by processors of the host system, or the like, may be used as a basis for determining whether the M-value should be modified, e.g., accounting or other financial workloads may require an increase in M since these are more computationally intensive workloads whereas a graphics rendering operation or other graphical workload may be able to use a relatively smaller M-value. The types of workloads or other processes being executed may be determined from metadata associated with the processes that identify the nature of the processes or workloads, for example. It should be appreciated that these are only examples and any operational characteristics of workloads, read/write operations, or the like, may be used as a basis for modifying the M-value used by the software ECC engine 106, 306 when performing software ECC operations.

In still a further illustrative embodiment, if the M-value needs to be set to a value that causes the amount of resources to be used for software based ECC operations to exceed an amount available from the on-device processor of the NAND flash device 100, 300, a mechanism may be provided for offloading the software based ECC operations to the processor(s) 107, 307 of the host system 105, 305. That is, if the M-value is currently set to a value where the software ECC operations are performed using the on-device processor 160, 360, however through monitoring the operation of the software ECC mechanisms it is determined that the M-value should be increased, a determination may be made as to whether the increase in M-value will cause a need for resources that exceeds that currently available via the on-device processor 160, 360. For example, the increased M-value may require additional processor cycles, additional memory space, or the like, which may negatively impact the performance of the NAND flash device 100, 300 to such a level that performance of the software ECC operations by the on-device processor 160, 360 is not desired. As a result, the uncorrected data, either with or without QOMs, may instead be forwarded by the gateway logic 140 to the host system 105 via the host interface 150.

Thus, with the illustrative embodiments of the present invention, a hybrid hardware/software ECC mechanism is provided that utilizes on-device hardware logic to determine whether the ECC for a particular portion of data should be performed using on-device hardware ECC logic in the NAND flash device node controller or software based ECC logic provided either in a host system or a processor of the NAND flash device. The illustrative embodiments may utilized fixed k and M-values for selecting and performing hardware/software ECC operations or may make use of variable k and M-values that may be selected dynamically based on operational characteristics of workloads, read/write operations, and the like. The illustrative embodiments further provide a mechanism by which all ECC operations, i.e. both hardware and software ECC operations, are performed within the NAND flash device itself and the host system only sees correct data being input from the NAND flash device. In some embodiments, determinations may be made on the NAND flash device as to whether software ECC operations should be performed by on-device processing resources or by the host system and the uncorrected data may be routed accordingly.

It should further be appreciated that the illustrative embodiments may be utilized in many different types of data processing environments. That is, the NAND flash device of one or more of FIGS. 1-3, or similar NAND flash device implementing the mechanisms of the illustrative embodiments, may be used in conjunction with various types of computing devices either as an integrated element of the computing device, e.g., an integrated NAND flash memory of the computing device, or as a peripheral or separate hardware device coupled to the computing device through an interface, e.g., a portable NAND flash memory device coupled to a computing device via a PCIe or Universal Serial Bus (USB), or other type of data communication interface.

Figure 4:
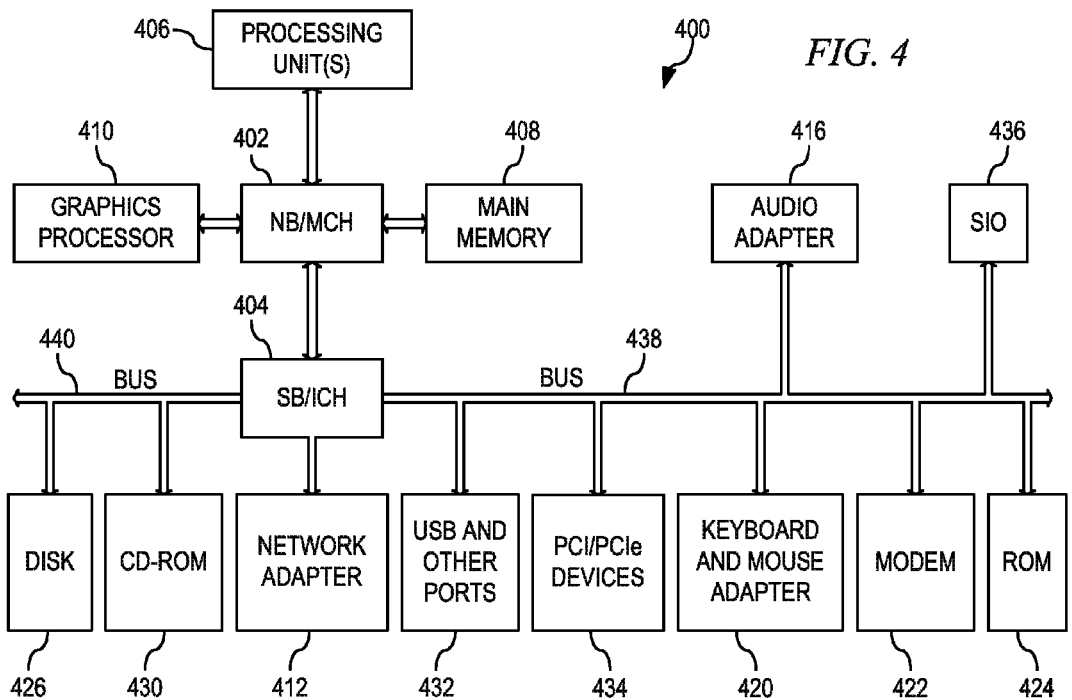
FIG. 4 is an example block diagram of a computing device in which aspects of the illustrative embodiments may be implemented.

In order to provide a context for the description of the specific elements and functionality of the illustrative embodiments, FIG. 4 is provided hereafter as an example environment in which aspects of the illustrative embodiments may be implemented. It should be appreciated that FIG. 4 is only an example and is not intended to assert or imply any limitation with regard to the environments in which aspects or embodiments of the present invention may be implemented. Many modifications to the depicted environment may be made without departing from the spirit and scope of the present invention.

FIG. 4 is a block diagram of an example data processing system in which aspects of the illustrative embodiments may be implemented. Data processing system 400 is an example of a computer, such as client, server, or portable computer, in which computer usable code or instructions implementing the processes for illustrative embodiments of the present invention may be located and with which a NAND flash device implementing hardware logic in accordance with the illustrative embodiments may be utilized.

In the depicted example, data processing system 400 employs a hub architecture including north bridge and memory controller hub (NB/MCH) 402 and south bridge and input/output (I/O) controller hub (SB/ICH) 204. Processing unit 406, main memory 408, and graphics processor 410 are connected to NB/MCH 402. Graphics processor 410 may be connected to NB/MCH 402 through an accelerated graphics port (AGP).

In the depicted example, local area network (LAN) adapter 412 connects to SB/ICH 404. Audio adapter 416, keyboard and mouse adapter 420, modem 422, read only memory (ROM) 424, hard disk drive (HDD) 426, CD-ROM drive 430, universal serial bus (USB) ports and other communication ports 432, and PCI/PCIe devices 434 connect to SB/ICH 404 through bus 438 and bus 440. PCI/PCIe devices may include, for example, Ethernet adapters, add-in cards, and PC cards for notebook computers. PCI uses a card bus controller, while PCIe does not. ROM 424 may be, for example, a flash basic input/output system (BIOS).

HDD 426 and CD-ROM drive 430 connect to SB/ICH 404 through bus 440. HDD 426 and CD-ROM drive 430 may use, for example, an integrated drive electronics (IDE) or serial advanced technology attachment (SATA) interface. Super I/O (SIO) device 436 may be connected to SB/ICH 404.

An operating system runs on processing unit 406. The operating system coordinates and provides control of various components within the data processing system 400 in FIG. 4. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 400.

As a server, data processing system 400 may be, for example, an IBM® eServer™ System P® computer system, running the Advanced Interactive Executive (AIX®) operating system or the LINUX® operating system. Data processing system 400 may be a symmetric multiprocessor (SMP) system including a plurality of processors in processing unit 406. Alternatively, a single processor system may be employed.

Instructions for the operating system, the object-oriented programming system, and applications or programs are located on storage devices, such as HDD 426, and may be loaded into main memory 408 for execution by processing unit 406. The processes for illustrative embodiments of the present invention may be performed by processing unit 406 using computer usable program code, which may be located in a memory such as, for example, main memory 408, ROM 424, or in one or more peripheral devices 426 and 430, for example.

A bus system, such as bus 438 or bus 440 as shown in FIG. 4, may be comprised of one or more buses. Of course, the bus system may be implemented using any type of communication fabric or architecture that provides for a transfer of data between different components or devices attached to the fabric or architecture. A communication unit, such as modem 422 or network adapter 412 of FIG. 4, may include one or more devices used to transmit and receive data. A memory may be, for example, main memory 408, ROM 424, or a cache such as found in NB/MCH 402 in FIG. 4.

Those of ordinary skill in the art will appreciate that the hardware in FIG. 4 may vary depending on the implementation. Other internal hardware or peripheral devices, such as flash memory, equivalent non-volatile memory, or optical disk drives and the like, may be used in addition to or in place of the hardware depicted in FIG. 4. Also, the processes of the illustrative embodiments may be applied to a multiprocessor data processing system, other than the SMP system mentioned previously, without departing from the spirit and scope of the present invention.

Moreover, the data processing system 400 may take the form of any of a number of different data processing systems including client computing devices, server computing devices, a tablet computer, laptop computer, telephone or other communication device, a personal digital assistant (PDA), or the like. In some illustrative examples, data processing system 400 may be a portable computing device that is configured with flash memory to provide non-volatile memory for storing operating system files and/or user-generated data, for example. Essentially, data processing system 400 may be any known or later developed data processing system without architectural limitation.

With the computing device of FIG. 4, one or more of the memory devices shown in FIG. 4 may be implemented as, or in conjunction with, a NAND flash memory device, such as one or more of the embodiments shown in FIGS. 1-3 or the like. Alternatively, or in addition, one or more NAND flash memory devices may be coupled to the computing device 400 via the USB and other ports 432, as a PCI/PCIe device 434, or the like. As such, the processing units 206 may execute software instructions, such as may be loaded from main memory 208, for implementing a software ECC engine for use with the NAND flash memory devices of the illustrative embodiments. Communication of data between the NAND flash memory devices may occur through the various buses 238, 240, bridges 202, 204, and the like.

Figure 5:
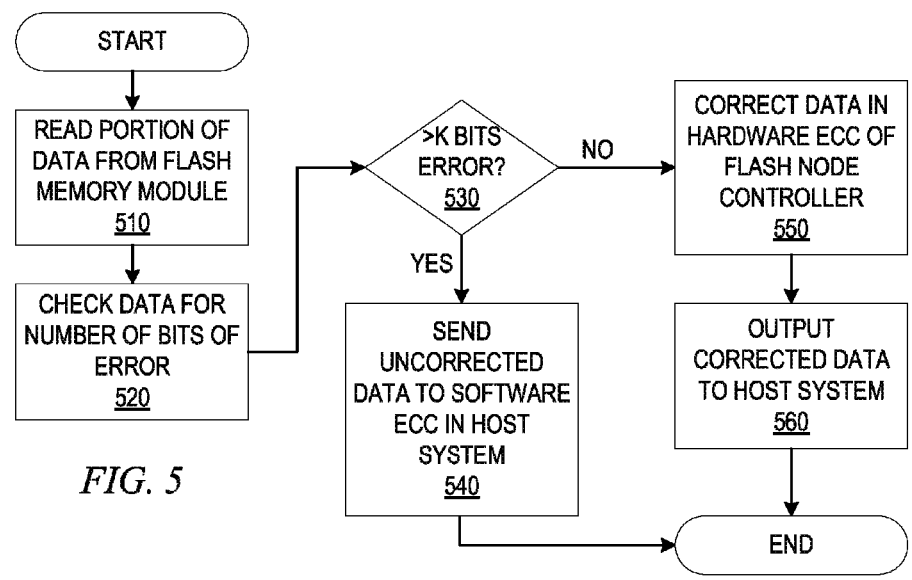
FIG. 5 is a flowchart outlining an example operation of a hybrid software/hardware ECC mechanism in accordance with one illustrative embodiment.

FIG. 5 is a flowchart outlining an example operation of a hybrid software/hardware ECC mechanism in accordance with one illustrative embodiment. The operation outlined in FIG. 5 may be performed in hardware of a NAND flash device node controller, for example. The operation outlined in FIG. 5 is for a read operation for reading data from a flash memory module of the NAND flash device.

As shown in FIG. 5, the operation starts with a read of a portion of data from the flash memory module of a NAND flash device (step 510). The portion of data is checked by an m-bit error checker to determine a number of error bits present in the portion of data (step 520). The detection of error bits within a portion of data in conjunction with NAND flash devices is generally known in the art and thus, the process for identifying which bits are erroneous will not be provided herein. Suffice it to say that there are many mechanisms, such as parity bits and the like, that may be utilized to identify bits within a portion of data that are erroneous and any of these mechanisms may be implemented in the illustrative embodiments for actually identifying how many bits are erroneous in a portion of data.

The m-bit error checker determines if the number of error bits in the portion of data is greater than k, where k is a value set for the particular architecture based on the maximum number of error bits that can be corrected by the hardware ECC engine of the NAND flash device (step 530). If the number of error bits in the portion of data is greater than k, then the uncorrected data is transmitted to the host system software ECC engine, optionally along with a queue order marker indicating a location in a data stream of the portion of data (step 540). If the number of error bits is equal to or less than k, then the data is provided to a hardware ECC engine of the NAND flash device (step 550) which then corrects the data and outputs the corrected data to the host system along with a queue order marker (step 560). The operation then terminates. It should be appreciated that the host system compiles the original data stream using the queue order markers and operates on the corrected data in the host system, where the corrected data may comprise one or both of data corrected both by the hardware ECC engine in the NAND flash device and corrected by the software ECC engine of the host system.

Figure 6:
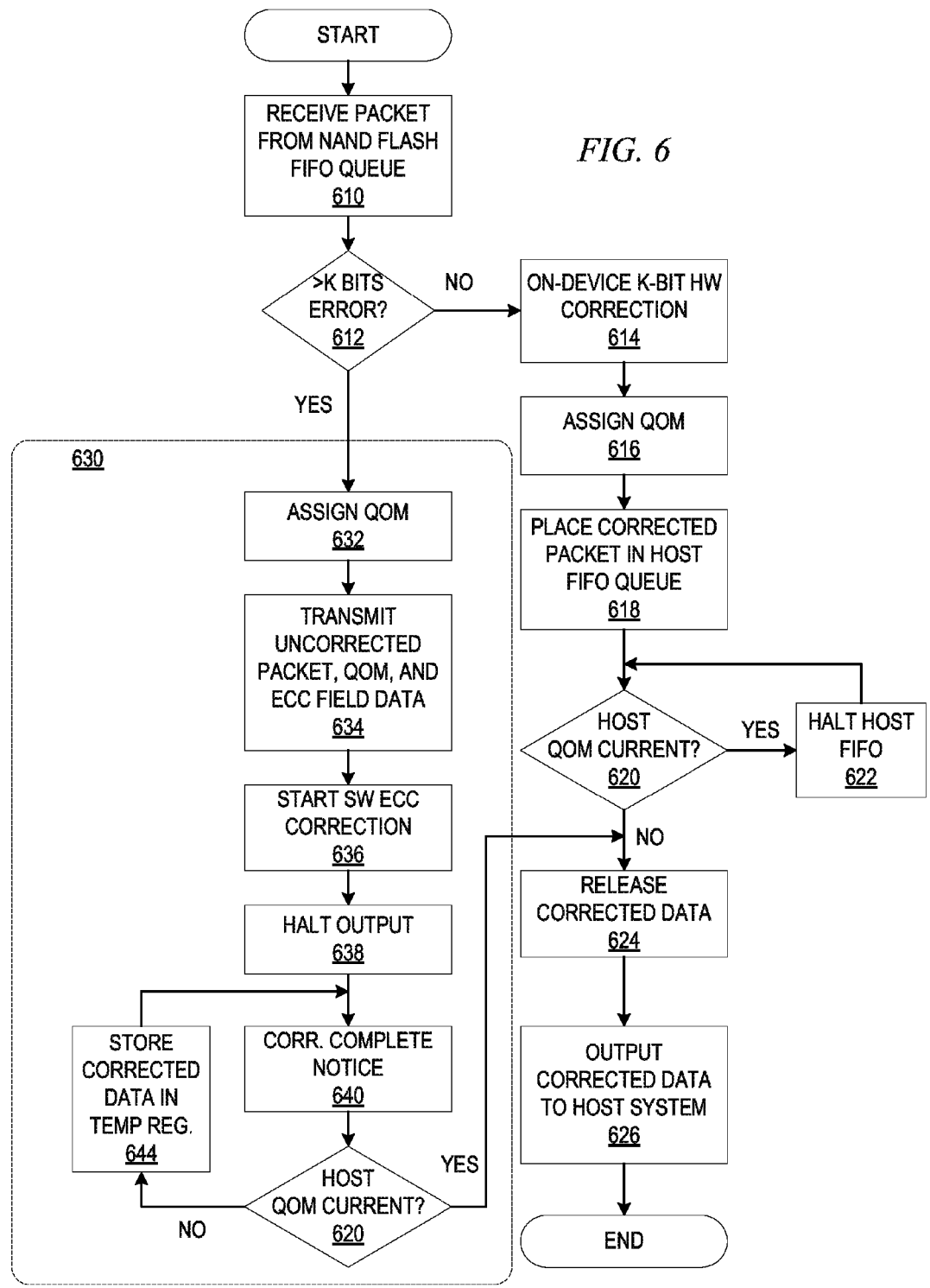
FIG. 6 is a flowchart outlining a more detailed operation of the read path of a NAND flash memory device in accordance with one illustrative embodiment.

FIG. 6 is a flowchart outlining a more detailed operation of the read path of a NAND flash memory device in accordance with one illustrative embodiment. The operation outlined in FIG. 6 assumes an architecture supporting out-of-order data packet error correction of the software ECC engine (either on the host system or on the NAND flash memory device itself). It should be appreciated that in architectures that do not facilitate out-of-order processing of data packets in this manner, a similar operation may be performed in which references to the QOM may be eliminated and in which the determination as to whether a host QOM is equal to the current QOM is eliminated. The operation outlined in FIG. 6 may be performed, for example, by a read engine of a NAND flash device node controller of a NAND flash device.

As shown in FIG. 6, the operation starts with the NAND flash device read FIFO, e.g., read FIFO 174, 374, outputting a data packet to the m-bit error checker 184, 384 of the read engine (step 610). The m-bit error checker determines if the number or error bits in the data packet is greater than the currently set k-value (step 612). If so, i.e. the "Yes" path of step 612, then out-of order data packet error correction is performed by the software ECC engine implemented either in the host system or in an on-device processor of the NAND flash device (step 630). If the number or error bits in the data packet is not greater than the currently set k-value, then on-device hardware ECC operations are performed as show by the "No" path of step 612 in FIG. 6.

If the number of error bits is equal to or less than k, then the ECC decoder for k-bit errors performs on-device hardware logic based ECC operations to correct the error bits in the data packet (step 614). A queue order marker (QOM) is assigned to the corrected data packet (step 616) and the corrected data packet is placed in the host FIFO queue (step 618). A determination is made as to whether the QOM of the data packet is equal to the host QOM, i.e. the QOM of the data that the host system is requesting for processing (step 620). If so, the host FIFO is halted, i.e. temporarily stalled or suspension of operation until the position within the FIFO becomes current (step 622). If not, the corrected data is released for use by the host system (step 624) and the NAND flash device outputs the corrected data to the host system (step 626). The operation then terminates.

Returning to step 612, if it is determined that the number of error bits is greater than k, then a QOM is assigned to the data packet (step 632) and the uncorrected data packet, the QOM, and ECC field data are transmitted to the software ECC engine (step 634). The software ECC engine is then initiated to perform its operations on the uncorrected data using the ECC field data (step 636). The output of the software ECC engine is halted (step 638) until a correction completion notice is generated indicating that the data packet error correction by the software ECC engine has been completed (step 640). A determination is then made as to whether the host QOM is current or not (step 642). If the host QOM is current, then the corrected data is released to the host system (step 646) and the NAND flash device outputs the corrected data to the host system (step 626). If the host QOM is not current, then the corrected data is stored in temporary registers (step 644) and the operation returns to step 640.

Figure 7:
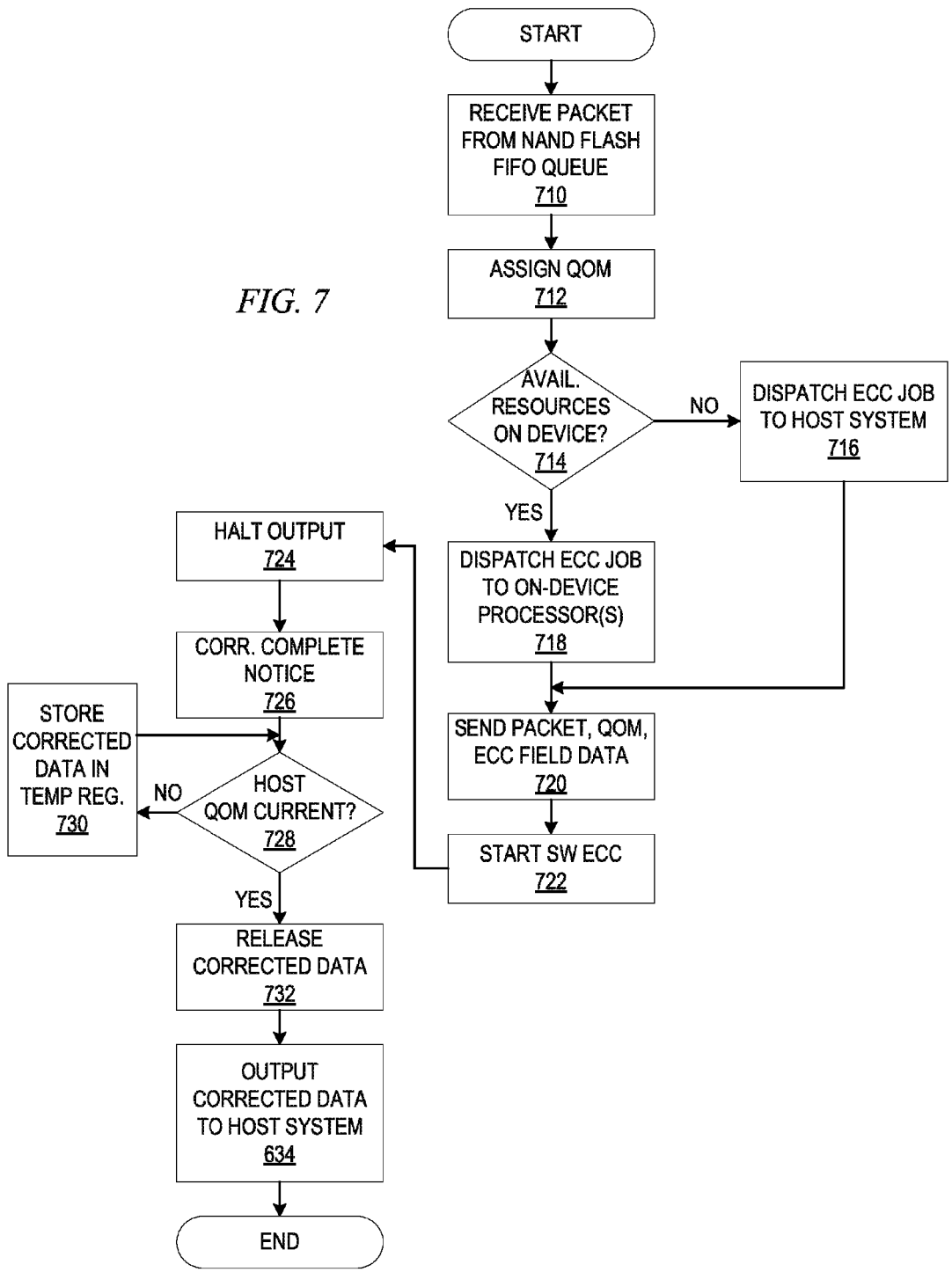
FIG. 7 is a flowchart outlining an example operation for performing hybrid hardware/software ECC operations utilizing on-device resources and/or host system resources for performing software ECC operations in accordance with one illustrative embodiment.

FIG. 7 is a flowchart outlining an example operation for performing hybrid hardware/software ECC operations utilizing on-device resources and/or host system resources for performing software ECC operations in accordance with one illustrative embodiment. In the operation outlined in FIG. 7, it is assumed that a determination has already been made that the number of error bits in the data packet exceeds the currently set k-value, such as via an operation outlined in FIG. 6 above, for example.

As shown in FIG. 7, the operation starts with the NAND flash device outputting data from the NAND flash FIFO queue to the read engine of the NAND flash device (step 710). A QOM is assigned to the data packet (step 712) and a determination is made as to whether there are available resources on the NAND flash device to perform the software ECC operations using the on-device resources, e.g., processor cores, memory capacity, etc. (step 714). The determination of whether there are available resources on the device itself may be influenced by the current M-value setting, as discussed above. Thus, if M is relatively larger, so are the amount of resources required to perform the software ECC operations. If this number of resources required to perform the M-bit error correct is larger than the available resources on the device, then the software ECC operations will need to be performed by the host system.

Thus, if there are not sufficient on-device resources to perform the software ECC operations, then ECC job is dispatched to the host system software ECC engine (step 716). If there are sufficient on-device resources to perform the software ECC operations, then the ECC job is dispatched to the on-device processor(s) (step 718). Whether the on-device processor(s) perform the software ECC operations or the host system processor(s) perform the software ECC operations, the uncorrected data, QOM, and ECC field data are transmitted to the selected processor(s) (step 720) and the selected processor(s) start their software ECC operations (step 722). The output of the software ECC operations is held (step 724) until a correction complete notice is generated (step 726).

A determination is made as to whether the QOM is current or not (step 728). If not current, the corrected data is stored in temporary registers (step 730). If the QOM is current, then the corrected data is released (step 732) and either utilized by the host system or output by the NAND flash device to the host system for use by the host system (step 734). The operation then terminates.

As mentioned above, during the design of a NAND flash device, mechanisms of the illustrative embodiments may be used to determine a range of k-values that can be used when configuring the NAND flash device. The mechanisms of the illustrative embodiments may make use of experimental hardware upon which workloads are run to generate empirical data, may make use of NAND flash device models and simulated workloads to generate simulated data, or the like, to determine this range of k-values. The resulting range of k-values may be used to allow a designer to selected a fixed k-value within the range of k-values that is suitable to the desired performance of the NAND flash device that is being produced. Alternatively, the range of k-values may be used to generate dynamically adjustable hardware logic in one or more NAND device node controllers of a NAND flash device and switching or enablement logic for switching or enabling the dynamically adjustable hardware logic.

Figure 8:
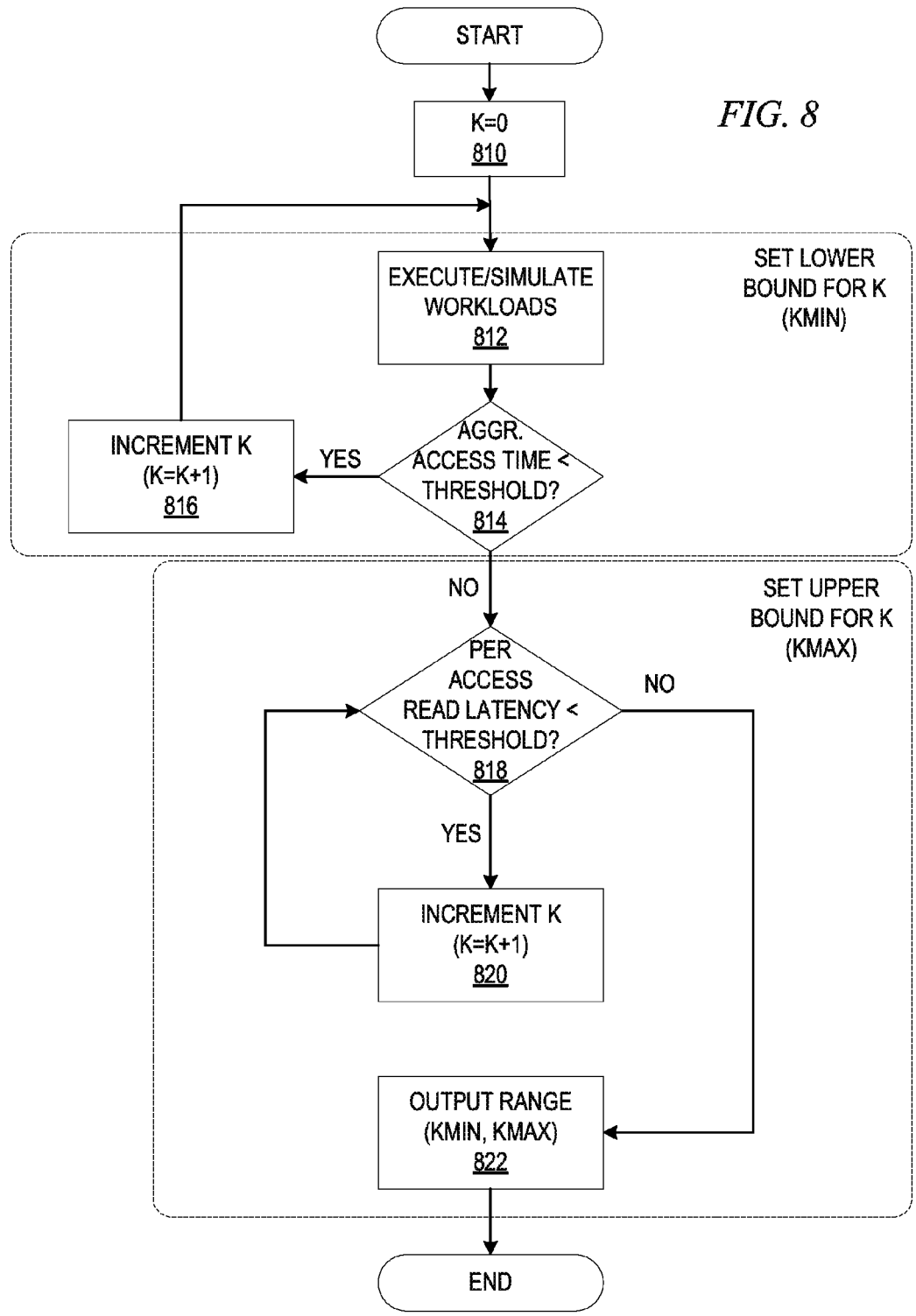
FIG. 8 is a flowchart outlining an example operation during a design phase of a NAND flash device for determining a range of k-values that may be used with a NAND flash device in accordance with one illustrative embodiment.

FIG. 8 is a flowchart outlining an example operation during a design phase of a NAND flash device for determining a range of k-values that may be used with a NAND flash device in accordance with one illustrative embodiment. As shown in FIG. 8, steps 812-816 may be utilized for determining a lower bound for the k range, i.e. a kmin value. Steps 818-820 are utilized for setting an upper bound on k, i.e. a kmax value. In one illustrative embodiment, the operation outlined in FIG. 8 may be performed by a software tool executed on a computing system, such as the computing system in FIG. 4, using a model of the NAND flash device and simulation tools. The operation in FIG. 8 may be a module of the simulation tools that generates the range of k-values while the simulation of the NAND flash device is being performed.

Initially, the value of k is set to 0 (step 810). Workloads are executed either empirically using experimental hardware or through simulation (step 812) to generate execute time data as well as other empirical/simulation data that may be used to set k-values and other design parameters of the NAND flash device. A determination is made as to whether the aggregated access time of the workloads run in step 812 is less than a predetermined timing threshold value, e.g., a time ceiling value (step 814). If so, then the k-value is incremented to a next higher k-value (step 816), e.g., k=k+1, and the operation returns to step 812 where additional workloads are executed and the process is repeated. If the aggregated access time of the workloads is equal to or exceeds the predetermined timing threshold value, then the k-value is set to kmin (step 817) and the operation continues to step 818 where the search for kmax begins.

A determination is made as to whether the per-access read latency with k-bit hardware ECC operations invoked is less than a second predetermined timing threshold value (step 818). If so, then the k-value is again incremented to a next value (step 820), e.g., k=k+1, and the operation returns to step 818 where a next read access is evaluated to determine if the read latency is less than the threshold value or not. If the per-access read latency is equal to or greater than the threshold timing value, then the k-value is set equal to kmax (step 821) and the range of kmin, kmax is output (step 822) for use in configuring the NAND flash device design. The operation then terminates.

Figure 9:
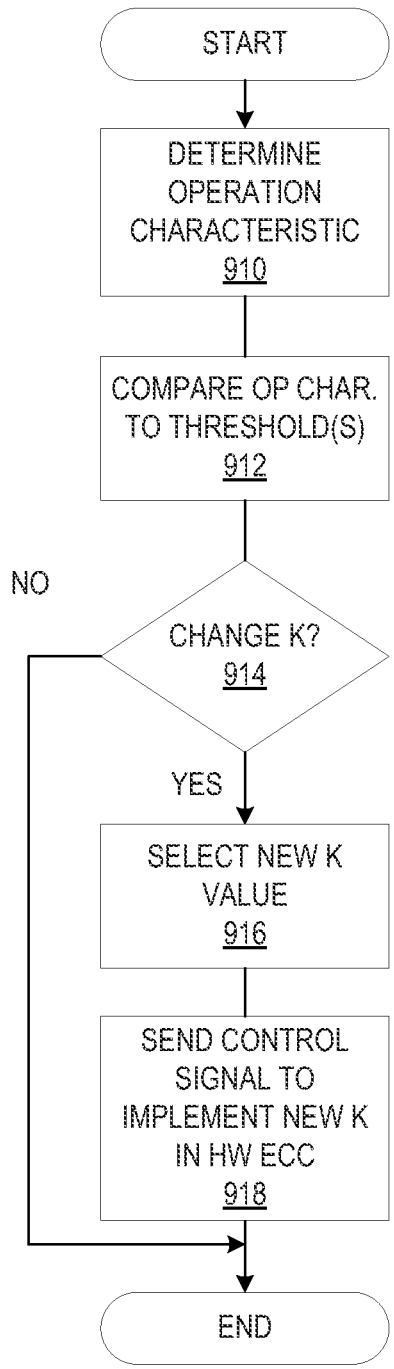
FIG. 9 is a flowchart outlining an example operation for adjusting the k-value of a hybrid hardware/software ECC mechanism in accordance with one illustrative embodiment.
Figure 10:
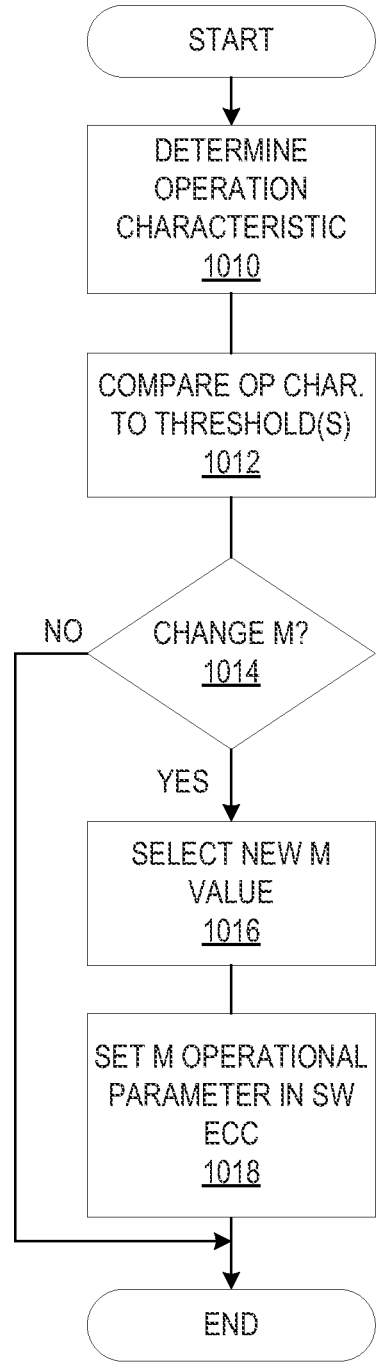
FIG. 10 is a flowchart outlining an example operation for adjusting the M-value of a hybrid hardware/software ECC mechanism in accordance with one illustrative embodiment.

As discussed above, in some illustrative embodiments, the k and M-values of the NAND flash device and software ECC engine are dynamically variable based on detected operational conditions of the NAND flash device, workloads being processed, and the nature of other processes being executed by the host system. FIG. 9 is a flowchart outlining an example operation for adjusting the k-value of a hybrid hardware/software ECC mechanism in accordance with one illustrative embodiment. FIG. 10 is a flowchart outlining an example operation for adjusting the M-value of a hybrid hardware/software ECC mechanism in accordance with one illustrative embodiment. It should be appreciated that the operations outlined in FIGS. 9 and 10 may be implemented entirely within a NAND flash device, such as in the case where the NAND flash device provides resources on the NAND flash device itself to implement software ECC engine operations, or may be distributed across the NAND flash device and a host system such that the NAND flash device may determine adjustments to the k-value (FIG. 9) while the host system may determined adjustments for the M-value (FIG. 10).

As shown in FIG. 9, the operation starts with determining operational characteristics of the hardware/software ECC operations performed by the NAND flash device and/or host system (step 910). For purposes of this example illustrative embodiment, the operational characteristic for setting the k-value will be considered to be the average latency of read operations being performed by the NAND flash device. A comparison of the operational characteristic to one or more threshold values is performed (step 912) and a determination is made as to whether a change in k-values is warranted based on the comparison (step 914). If so, a determination is made as to whether k should be increased or decreased. This determination may be made based on whether the comparison indicates that the one or more threshold values are met or exceeded or whether the one or more thresholds are met and/or not exceeded. For example, if the threshold is met or exceeded, then the k-value may be increased so as to reduce average latency. If the threshold value is not met or exceeded, then the k-value may be decreased.

If a change in k-value is warranted, then a new k-value is selected based on a degree to which the operational characteristic meets/exceeds, or does not meet/exceed, the threshold value (step 916). In one illustrative embodiment, there may be only two possible settings in the NAND flash device, e.g., kmin/kmax, in which case if the threshold value is met or exceeded, then the NAND flash device is configured to kmax, and if the threshold value is not met or exceeded, then the NAND flash device is configured to kmin. In other illustrative embodiments, various k-values between kmin and kmax may be made possible in which case a corresponding k-value is selected based on a degree of difference between the threshold value and the detected operational characteristic.

A corresponding control signal is sent to the hardware ECC logic and m-bit error checking logic of the NAND flash device node controller to implement the newly selected k-value (step 918). The operation then terminates.

With reference now to FIG. 10, the operation for adjusting the M-value begins again by collecting operational characteristic data for ECC operations performed by the software ECC engine (step 1010). For purposes of this example illustrative embodiment, the operational characteristic for setting the M-value will be considered to be the averaged number of error bits in received data packets by the software ECC engine over a predetermined period of time. A comparison of the operational characteristic to one or more threshold values is performed (step 1012) and a determination is made as to whether a change in M-values is warranted based on the comparison (step 1014). If so, a determination is made as to whether M should be increased or decreased. This determination may be made based on whether the comparison indicates that the one or more threshold values are met or exceeded or whether the one or more thresholds are met and/or not exceeded. For example, if the threshold is met or exceeded, then the M-value may be increased so as to increase the amount of resources allocated for software ECC operations. If the threshold value is not met or exceeded, then the M-value may be decreased so as to release resources for other useful work.

If a change in M-value is warranted, then a new M-value is selected based on a degree to which the operational characteristic meets/exceeds, or does not meet/exceed, the threshold value (step 1016). In one illustrative embodiment, the M-value may be set to the average number of error bits identified during the collection of operational characteristic information, for example. A corresponding operational parameter for the software ECC engine is set based on the selected M-value (step 1018). The operation then terminates As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a Not AND (NAND) flash memory device, for providing hybrid error correction management, the method comprising:
    providing a Not AND (NAND) flash memory module and a node controller coupled to the NAND flash memory module in the NAND flash memory device;
    providing a hardware logic implemented error correction code (ECC) engine associated with the node controller;
    configuring the node controller to determine whether an error count is less than or equal to a first threshold number of error bits and, in response to the error count being less than or equal to the first threshold number of error bits, performing correction of the error bits by the hardware logic implemented ECC engine associated with the node controller, wherein the hardware logic implemented ECC engine is provided in a read engine of the node controller of the NAND flash memory device, wherein the read engine outputs either corrected data packets or uncorrected data packets to a multiplexer of a node controller interface of the NAND flash memory device based on whether or not the error count is equal to or less than the first threshold number of error bits, wherein the first threshold number of error bits is a dynamically determined value during runtime operation of the NAND flash memo device, and wherein the first threshold number of error bits is set to a value via hardware implemented setting logic in the node controller, and wherein the first threshold number of error bits is set to the value via the hardware implemented setting logic in the node controller based on a determined type of workload being executed by a host system to which the NAND flash memory device is coupled and a detected latency in error correction operations; and
    configuring the node controller to forward uncorrected data packets to a software logic implemented ECC engine in a host system via interface logic, in response to the error count being greater than the first threshold number of error bits.

2. The method of claim 1, wherein the NAND flash memory device is one of a flash memory card coupled to a host system via a card slot of the host system or a portable NAND flash memory device.

3. The method of claim 1, wherein the first threshold number of error bits is set to a value causing a majority of error correction operations for data read from the NAND flash memory module to be performed by the hardware logic implemented ECC engine.

4. The method of claim 1, wherein the software logic implemented ECC engine:
    assigns a read queue order number to read packets in a stream of read packets read from the NAND flash memory module;
    tracks and arbitrates read queue order based on the assigned read queue order numbers; and
    corrects errors in the read packets of the stream of read packets based on the read queue order.

5. The method of claim 1, wherein the first threshold number of error bits is a fixed value set during design of the NAND flash memory device based on iterative simulation of the executions of workloads on a model of the NAND flash memory device to generate a lower bound value for the first threshold number of error bits based on a determined aggregate access time of the workloads, and an upper bound value for the first threshold number of error bits based on a per access read latency of the workloads, and wherein the first threshold number of error bits is selected to be a value in a range defined by the lower bound value and the upper bound value.

6. The method of claim 1, wherein the software logic implemented ECC engine performs error correction operations for error bits up to and including a second threshold number of error bits, and wherein the second threshold number of error bits is dynamically set according to a determined type of workload for which data is read from the NAND flash memory module of the NAND flash memory device.

7. The method of claim 1, wherein the software logic implemented ECC engine comprises logic executing on one of a processor of a host computing device coupled to the NAND flash memory device or a processor integrated in the NAND flash memory device.

8. The method of claim 1, wherein the multiplexer outputs either corrected data packets or uncorrected data packets to the interface logic of the NAND flash memory device based on whether or not the error count is equal to or less than the first threshold number of error bits, and wherein the interface logic comprises setting logic for setting a value of the first threshold number of error bits by providing a control signal back to the hardware logic implemented ECC engine to cause the hardware logic implemented ECC engine to be reconfigured to the value set by the setting logic.

9. A Not AND (NAND) flash memory device, comprising:
a Not AND (NAND) flash memory module;
a node controller coupled to the NAND flash memory module; and
a hardware logic implemented error correction code (ECC) engine associated with the node controller, wherein the node controller is configured to:
determine whether an error count is less than or equal to a first threshold number of error bits and, in response to the error count being less than or equal to the first threshold number of error bits, perform correction of the error bits by the hardware logic implemented ECC engine associated with the node controller, wherein the hardware logic implemented ECC engine is provided in a read engine of the node controller of the NAND flash memory device, wherein the read engine outputs either corrected data packets or uncorrected data packets to a multiplexer of a node controller interface of the NAND flash memory device based on whether or not the error count is equal to or less than the first threshold number of error bits, wherein the first threshold number of error bits is a dynamically determined value during runtime operation of the NAND flash memory device, and wherein the first threshold number of error bits is set to a value via hardware implemented setting logic in the node controller, and wherein the first threshold number of error bits is set to the value via the hardware implemented setting logic in the node controller based on a determined type of workload being executed by a host system to which the NAND flash memory device is coupled and a detected latency in error correction operations; and
forward uncorrected data packets to a software logic implemented ECC engine in a host system via interface logic, in response to the error count being greater than the first threshold number of error bits.

10. The NAND flash memory device of claim 9, wherein the NAND flash memory device is one of a flash memory card coupled to a host system via a card slot of the host system or a portable NAND flash memory device.

11. The NAND flash memory device of claim 9, wherein the first threshold number of error bits is set to a value causing a majority of error correction operations for data read from the NAND flash memory module to be performed by the hardware logic implemented ECC engine.

12. The NAND flash memory device of claim 9, wherein the software logic implemented ECC engine:
assigns a read queue order number to read packets in a stream of read packets read from the NAND flash memory module;
tracks and arbitrates read queue order based on the assigned read queue order numbers; and
corrects errors in the read packets of the stream of read packets based on the read queue order.

13. The NAND flash memory device of claim 9, wherein the first threshold number of error bits is a fixed value set during design of the NAND flash memory device based on iterative simulation of the executions of workloads on a model of the NAND flash memory device to generate a lower bound value for the first threshold number of error bits based on a determined aggregate access time of the workloads, and an upper bound value for the first threshold number of error bits based on a per access read latency of the workloads, and wherein the first threshold number of error bits is selected to be a value in a range defined by the lower bound value and the upper bound value.

14. The NAND flash memory device of claim 9, wherein the software logic implemented ECC engine performs error correction operations for error bits up to and including a second threshold number of error bits, and wherein the second threshold number of error bits is dynamically set according to a determined type of workload for which data is read from the NAND flash memory module of the NAND flash memory device.

15. The NAND flash memory device of claim 9, wherein the software logic implemented ECC engine comprises logic executing on one of a processor of a host computing device coupled to the NAND flash memory device or a processor integrated in the NAND flash memory device.

16. The NAND flash memory device of claim 9, wherein the multiplexer outputs either corrected data packets or uncorrected data packets to the interface logic of the NAND flash memory device based on whether or not the error count is equal to or less than the first threshold number of error bits, and wherein the interface logic comprises setting logic for setting a value of the first threshold number of error bits by providing a control signal back to the hardware logic implemented ECC engine to cause the hardware logic implemented ECC engine to be reconfigured to the value set by the setting logic.

* * * * *